(12) United States Patent
Xia et al.

(10) Patent No.: US 8,435,428 B2
(45) Date of Patent: May 7, 2013

(54) METHODS FOR FORMING A RUTHENIUM-BASED FILM ON A SUBSTRATE

(75) Inventors: Bin Xia, Plano, TX (US); Ashutosh Misra, Plano, TX (US)

(73) Assignee: Air Liquide Electronics U.S. LP, Dallas, TX (US)

( * ) Notice: Subject to any disclaimer, the term of this patent is extended or adjusted under 35 U.S.C. 154(b) by 0 days.

(21) Appl. No.: 13/010,018

(22) Filed: Jan. 20, 2011

(65) Prior Publication Data

US 2011/0171836 A1    Jul. 14, 2011

Related U.S. Application Data

(63) Continuation of application No. 12/034,776, filed on Feb. 21, 2008, now Pat. No. 7,906,175.

(60) Provisional application No. 60/890,916, filed on Feb. 21, 2007.

(51) Int. Cl.
*H01B 1/12* (2006.01)

(52) U.S. Cl.
USPC .............. 252/519.3; 257/E21.266; 438/785

(58) Field of Classification Search .............. 252/519.3; 257/E21.266; 438/785
See application file for complete search history.

(56) References Cited

U.S. PATENT DOCUMENTS

| | | | |
|---|---|---|---|
| 5,248,496 A | 9/1993 | Schuster et al. | |
| 5,358,889 A | 10/1994 | Emesh et al. | |
| 5,378,492 A | 1/1995 | Mashiko | |
| 5,496,582 A | 3/1996 | Mizutani et al. | |
| 6,036,741 A | 3/2000 | Shindo et al. | |
| 6,063,705 A | 5/2000 | Vaartstra | |
| 6,143,192 A | 11/2000 | Westmoreland | |
| 6,281,125 B1 | 8/2001 | Vaartstra et al. | |
| 6,303,809 B1 | 10/2001 | Chi et al. | |
| 6,458,183 B1 | 10/2002 | Phillips et al. | |
| 6,479,100 B2 | 11/2002 | Jin et al. | |
| 6,537,461 B1 | 3/2003 | Nakahara et al. | |
| 6,541,067 B1 | 4/2003 | Marsh et al. | |
| 6,580,111 B2 | 6/2003 | Kim et al. | |
| 6,605,735 B2 | 8/2003 | Kawano et al. | |
| 6,610,873 B2 | 8/2003 | Saito | |
| 6,737,313 B1 | 5/2004 | Marsh et al. | |
| 6,824,824 B2 | 11/2004 | Saito | |
| 6,844,261 B2 | 1/2005 | Marsh et al. | |
| 7,002,033 B1 | 2/2006 | Sakai et al. | |
| 7,316,962 B2 | 1/2008 | Govindarajan | |
| 7,544,389 B2 | 6/2009 | Dussarrat et al. | |
| 7,906,175 B2 * | 3/2011 | Xia et al. ................... | 427/248.1 |
| 2002/0004293 A1 | 1/2002 | Soininen et al. | |
| 2002/0173054 A1 | 11/2002 | Kim | |
| 2003/0036242 A1 | 2/2003 | Yang | |
| 2003/0037802 A1 | 2/2003 | Nakahara et al. | |
| 2003/0073294 A1 | 4/2003 | Marsh | |
| 2004/0105934 A1 * | 6/2004 | Chang et al. ............. | 427/255.28 |
| 2004/0241321 A1 | 12/2004 | Ganguli et al. | |
| 2006/0162658 A1 | 7/2006 | Weidman | |
| 2007/0160756 A1 | 7/2007 | Treichel | |
| 2007/0190362 A1 | 8/2007 | Weidman | |
| 2008/0038465 A1 | 2/2008 | Dussarrat | |
| 2008/0121249 A1 | 5/2008 | Gatineau et al. | |
| 2008/0171436 A1 | 7/2008 | Koh et al. | |
| 2008/0214003 A1 | 9/2008 | Xia et al. | |
| 2010/0116738 A1 * | 5/2010 | Xia et al. ...................... | 210/638 |
| 2012/0231180 A1 * | 9/2012 | Xia et al. ...................... | 427/569 |

FOREIGN PATENT DOCUMENTS

| | | |
|---|---|---|
| EP | 1 717 343 | 11/2006 |
| JP | 57 206210 | 6/1984 |
| JP | 60 087855 | 5/1985 |
| JP | 63 287549 | 11/1988 |
| JP | 06 009223 | 1/1994 |
| JP | 06 021788 | 5/1994 |
| JP | 2000 083929 | 3/2000 |
| JP | 2001 284317 | 10/2001 |
| JP | 2003 027240 | 1/2003 |
| JP | 2005 206874 | 8/2005 |
| JP | 2006 097044 | 4/2006 |
| KR | 2007 0005870 | 1/2007 |
| KR | 2007 0115146 | 12/2007 |
| KR | 2008 0066619 | 7/2008 |
| KR | 2009 0115155 | 11/2009 |
| WO | WO 00 15865 | 3/2000 |
| WO | WO 2004 046417 | 6/2004 |
| WO | WO 2005 020317 | 3/2005 |

(Continued)

OTHER PUBLICATIONS

Burkey, D.J. et al. "Encapsulated Alkaline-Earth Metallocenes. 2. Triisopropylcyclopentadienyl systems, $[(C_3H_7)_3C_5H_2]_2Ae(THF)_n$ (Ae = Ca, Sr, Ba; n = 0-2), and the crystal structure of $[(C_3H_7)_3C_5H_2]_2Ba(THF)_2$,", Organometallics, vol. 12, No. 4, 1993, pp. 1331-1337.

(Continued)

*Primary Examiner* — Douglas MC Ginty
(74) *Attorney, Agent, or Firm* — Patricia E. McQueeney

(57) ABSTRACT

Methods for forming a film on a substrate in a semiconductor manufacturing process. A reaction chamber a substrate in the chamber are provided. A ruthenium based precursor, which includes ruthenium tetroxide dissolved in a mixture of at least two non-flammable fluorinated solvents, is provided and a ruthenium containing film is produced on the substrate.

9 Claims, 2 Drawing Sheets

FOREIGN PATENT DOCUMENTS

| WO | WO 2006 035281 | 4/2006 |
|---|---|---|
| WO | WO 2006 057707 | 6/2006 |
| WO | WO 2008 088563 | 7/2008 |
| WO | WO 2009 118708 | 10/2009 |

OTHER PUBLICATIONS

Frohlich, K. et al. "Preparation of SrRuO3 Films for Advanced CMOS Metal Gates", Material Science in Semiconductor Processing 7 (2004) pp. 265-269.

Hatanpaa, T. et al. "Synthesis and Characterisation of Cyclopentadienyl Complexes of Barium: Precursors for Atomic Layer Deposition of BaTiO3", Dalton Transactions, Mar. 8, 2004, pp. 1181-1188.

Igarashi, H. et al. "Absorption Behaviour of Gaseous Ruthenium into Water", Radiochimica Acta, 57, 51-55, 1992.

Jelenkovic, E.V. et al. "Degradation of RuO2 Thin Films in Hydrogen Atmosphere at Temperatures Between 150 and 250° C.", The Institution of Electrical Engineers, Stevenage, Great Britain, Jan. 2003.

Kang, J.-S. et al. "Metal-Organic CVD of a (Ba,Sr)RuO3 Oxide Electrode Using a Single Cocktail Source", Chemical Vapor Deposition, vol. 11, No. 1, Jan. 1, 2005, pp. 17-20.

Kang, S.-Y. et al. "Deposition and characterization of Ru thin films prepared by metallorganic chemical vapor deposition", J. Korean Phys. Soc., 2000, vol. 37, No. 6, pp. 1040-1044.

Kepak, F. et al. "Removal of $RuO_4$ vapors on natural clinoptilolite", J. Radioanalytical and Nucl. Chem., vol. 159, No. 2, pp. 317-334, 1992.

Kepak, F. et al. "Sorption of $^{106}RuO_4$ vapours on molecular sieve Zeolon 500", Isotopenpraxis, 21(2), S.58 bis 62, 1985.

Kepak, F. et al. "Sorption of $^{106}RuO_4$ vapours on natural and synthetic molecular sieves", Isotopenpraxis, 26(2), pp. 73-78, 1990.

Kukli, K. et al. "Atomic Layer Deposition of Calcium Oxide and Calcium Hafnium Oxide Film Using Calcium Cyclopentadienyl Precursors", Thin Solid Films, vol. 500, No. 1-2, Apr. 3, 2006, pp. 322-323.

Lai, Y.-H. et al. "Synthesis and characterization of ruthenium complexes with two fluorinated amino alkoxide chelates. The quest to design suitable MOCVD source reagents", Chemistry of Materials American Chem. Soc. USA, vol. 15, No. 12, Jun. 17, 2003, pp. 2454-2462.

Lee, J.-H. et al. "Chemical vapor deposition of RuO2 thin films using the liquid precursor Ru(OD)3", Electrochemical and Solid-State Letters, 1999, vol. 2, pp. 622-623.

Maas, E.T. et al. "Confinement of Ruthenium Oxides Volatized During Nuclear Fuels Reprocessing", Nucl. Technol., 1979.

McMurray, H.N. et al. "Uniform Collois dof Ruthenium Dioxide Hydrate Evolved by the Surface-Catalyzed Reduction of Ruthenium Tetroxide", J. Phys. Chem., 1993, 97, 8039-8045.

Park, S.-E. et al. "Metallorganic chemical vapor deposition of Ru and RuO2 using ruthenocene precursor and oxygen gas", J. Electrochemical Soc., 2000, vol, 147, pp. 203-209.

Sankar, J, et al. "Low Temperature Chemical Vapour Deposition of Ruthenium and Ruthenium Dioxide on Polymer Surfaces", J. Mater. Chem., 1999, 9, pp. 2439-2444.

Shibutani, T. et al. "A Novel Ruthenium Precursor for MOCVD without Seed Ruthenium Layer", Tosch R&D Review, 47, 2003.

Vehkamaki, M. et al. "Atomic Layer Deposition of BaTiO3 Thin Films—Effect of Barium Hydroxide Formation", Chemical Vapor Deposition, vol. 13, No. 5, May 1, 2007, pp. 239-246.

Yuan, Z. et al. "Low-temperature chemical vapor deposition of ruthenium dioxide from ruthenium tetroxide: A simple approach to high-purity $RuO_2$ films", Chemistry of Materials, American Chemical Society, Washington, US, vol. 5, No. 7, Jul. 1993, pp. 908-910.

International Search Report and Written Opinion for related PCT/IB2004/004131, May 4, 2005.

International Search Report and Written Opinion for related PCT/IB2005/000835, Jun. 16, 2005.

International Search Report and Written Opinion for related PCT/IB/2005/002833, Jan. 18, 2006.

International Search Report and Written Opinion for directly related PCT/IB2008/050637, Feb. 23, 2009.

International Search Report and Written Opinion for related PCT/IB2008/051324, Sep. 3, 2008.

International Search Report and Written Opinion for related PCT/IB2009/051276, Jul. 6, 2009.

3M™ Novec™ Engineered Fluid HFE 7100, 2004.

3M™ Novec™ Engineered Fluid HFE 7200, 2004.

Vujisic, L. et al. "Adsorption of gaseous RuO4 by various solvents", $17^{th}$ DOE Nuclear Air Cleaning and Treatment Conf., Denver, Colorado, Aug. 2-5, 1982, pp. 123-130.

Choi, G.-J. et al., "Atomic layer deposition of TiO2 films on Ru buffered TiN electrode for capacitor applications," Journal of the Electrochemical Society, 2009, 156 (7), pp. G71-G77.

Funakubo, H. et al., "Metal organic chemical vapor deposition growth of epitaxial SrRuO3 and CaRuO3 thin films with different orientations as the bottom electrode for epitaxial ferroelectric thin film," Journal of Crystal Growth, 2002, 235, pp. 401-406.

Han, J.H. et al., "Chemical vapor deposition of Ru thin films with an enhanced morphology, thermal stability and electrical properties using a RuO precursor," Chemistry of Materials, 2009, 21 (2), pp. 207-209.

Han, J.H. et al., "Pulsed-chemical vapor deposition of ruthenium and ruthenium dioxide thin films using Ru04 precursor for the Dram capacitor electrode," ECS Transactions, 2009, 19 (2), p. 717-728.

Higashi, N. et al., "Crystal structure comparison between conductive $SrRuO_3$ and $CaRuO_3$ thin films," Journal of Crystal Growth, 2001, 229, pp. 450-456.

Higashi, N. et al., "Metalorganic chemical vapor deposition of conductive CaRuO3 thin films," Japan Journal of Applied Physics, 2000, 3, pp. 2780-2783.

Higashi, N. et al., "New control method of low deposition temperature limit of metal-organic chemical vapor deposition (MOCVD) by the introduction of organic vapor—Application to $SrRuO_3$ film preparation," Thin Solid Films, 2002, 409, pp. 33-36.

Katamreddy, R. et al., "Tuning of material and electrical properties of strontium titanates using process chemistry and composition," ECS Transactions, 2008, 16 (5), pp. 487-496.

Kwon, O.-K. et al., "Peald of a ruthenium adhesion layer for copper interconnects," Journal of the Electrochemical Society, 2004, 151 (12), pp. C753-C756.

Okuda, N. et al., "Low temperature deposition of $SrRuO_3$ thin film prepared by metalorganic chemical vapor deposition," Japan Journal of Applied Physics, 2000, 39, p. 572-576.

Schwarzkopf, J. et al., "Depositions of $SrRuO_3$ thin films on oxide substrates with liquid-delivery spin Mocvd," Thin Solid Films, 2009, xxx, pp. xxx-xxx.

Song, Y.W. et al., "Atomic layer deposition of Ru by using a new Ru-precursor," ECS Transactions, 2006, 2 (4), pp. 1-11.

Vehkamaki, M. et al., "Atomic layer deposition of $SrTiO_3$ thin films from a novel strontium precursor—Strontium-bis(tri-isopropylcyclopentadienyl)," Chemical Vapor Deposition, 2001, 7 (2), p. 75-80.

Vehkamaki, M. et al., "Growth of $SrTiO_3$ and $BaTiO_3$ thin films by atomic layer deposition," Electrochemical and Solid-State Letters, 1999, 2 (10), pp. 504-506.

* cited by examiner

METHODS FOR FORMING A RUTHENIUM-BASED FILM ON A SUBSTRATE

CROSS REFERENCE TO RELATED APPLICATIONS

The present application is a continuation of Ser. No. 12/034,776, filed Feb. 21, 2008, now U.S. Pat. No. 7,906,175, issued on Mar. 15, 2011, which claims the benefit of US Provisional Application No. 60/890,916, filed Feb. 21, 2007, herein incorporated by reference in its entirety for all purposes.

BACKGROUND

1. Field of the Invention

This invention relates generally to the field of semiconductor fabrication. More specifically, the invention relates to a method of forming a ruthenium containing film on a substrate.

2. Background of the Invention

Ruthenium and ruthenium compounds such as ruthenium oxide are materials considered to be promising for use as capacitor electrode materials in the next generation DRAMs. High dielectric constant materials (aka high-k materials) such as alumina, tantalum pentoxide, hafnium oxide, and barium-strontium titanate (BST) are currently used for these capacitor electrodes. These high-k materials, however, are produced using temperatures as high as 600° C., which results in oxidation of polysilicon, silicon, and aluminum and causes a loss of capacitance. Both ruthenium and ruthenium oxide, on the other hand, exhibit a high oxidation resistance and high conductivity and are suitable for application as capacitor electrode materials. They also function effectively as oxygen diffusion barriers. Ruthenium has also been proposed for the gate metal for lanthanide oxides. In addition, ruthenium is more easily etched by ozone and by a plasma using oxygen than are platinum and other noble metal compounds. The use of ruthenium as a barrier layer separating low-k material from plated copper and as a seed layer has also been attracting attention recently.

High-quality films of ruthenium and ruthenium oxide ($RuO_2$) can be deposited under appropriate conditions from a precursor of high-purity ruthenium tetroxide ($RuO_4$). This precursor can also be used for the deposition (film formation) of perovskite-type materials, such as strontium ruthenium oxide, that exhibit an excellent conductivity and a three-dimensional structure very similar to that of barium-strontium titanate and strontium titanium oxide.

However, high-purity ruthenium tetroxide, is a strong oxidizing agent, and is considered to have a high toxicity. In addition, high-purity ruthenium tetroxide has a boiling point of about 130° C. and therefore it presents an explosion risk at high temperatures (above about 108° C.). It is therefore recommended that pure ruthenium tetroxide be stored at low temperatures in order to avoid its potential for decomposition (explosion).

Given these properties of ruthenium tetroxide ($RuO_4$) (particularly the explosion risk during holding), when used as a reactant it is normally necessary to use it diluted in an appropriate solvent. Water, carbon tetrachloride, and alkanes, for example, are known for use as this solvent.

In the case of water as a solvent it is further necessary to add a stabilizer such as $NaIO_4$ in order to prevent $RuO_4$ from reacting and decomposing during holding. Further, the use of such an aqueous $RuO_4$ solution as a ruthenium based precursor may result in the introduction of impurities into the film and the tool (e.g., reaction chamber).

The electronics industry is abandoning carbon tetrachloride due to its high toxicity; therefore it becomes a less than ideal solvent choice for a ruthenium tetroxide precursor solution.

Alkanes such as pentane and octane are can be used as solvents for $RuO_4$, but the reaction between the alkane (for example, pentane) and $RuO_4$ causes the incorporation of carbon when alkane containing dissolved $RuO_4$ is used as a ruthenium based precursor in film production. Carbon causes an increase in the resistance of ruthenium-type films, and as a consequence the presence of carbon during film production can be seen as less than ideal.

BRIEF SUMMARY

Novel methods and formulations for providing a film on a substrate in a semiconductor manufacturing process are described herein. The disclosed methods and formulations utilize a mixture of ruthenium tetroxide dissolved in a mixture of at least two non-flammable fluorinated solvents.

In an embodiment, a method for providing a film on substrate in a semiconductor manufacturing process comprises, providing a reaction chamber and a substrate contained within the chamber. A ruthenium based precursor is provided, where the precursor comprises a mixture of at least two non-flammable fluorinated solvents, ruthenium tetroxide dissolved in the solvent mixture, and less than about 100 ppm of moisture. A ruthenium containing film is then deposited on the substrate.

Other embodiments of the current invention may include, without limitation, one or more of the following features:
  each of the non-flammable fluorinated solvents has the general formula $C_xH_yF_zO_tN_u$; wherein
    $x \geq 3$
    $y+z \leq 2x+2$;
    $z \geq 1$;
    $t \geq 0$;
    $u \geq 0$; and
    $t+u \geq 0$
    wherein x, y, z, t, and u are all integers.
  the solvent mixture is a mixture of methyl nonafluorobutyl ether and ethyl nonafluorbutyl ether;
  the solvent mixture comprises between about 10% and 90%, preferably about 30%, by volume, of methyl non-afluorobutyl ether;
  the solvent mixture comprises between about 10% and 90%, preferably about 70%, by volume, of ethyl non-afluorobutyl either;
  the precursor contains less than about 1 ppm of moisture;
  the precursor contains less than about 1 ppm of unassociated, or free, oxygen ($O_2$);
  the pressure in the reaction chamber is maintained between about 0.01 torr and about 1000 torr;
  the film is deposited onto a substrate which is maintained at a temperature between about 50° C. and about 800° C., preferably between about 100° C. and abut 600° C.;
  a gaseous reducing agent is introduced into the reaction chamber, and a ruthenium containing film is deposited on the substrate through a reaction between the reducing agent and the precursor;
  the reducing agent is one of hydrogen, air or oxygen;
  the reducing agent and the precursor are introduced into the chamber simultaneously;
  the precursor is introduced, in its liquid state, into a vaporizer;

the precursor is at least partially vaporized to form a vapor state precursor;

the liquid state precursor is introduced to the vaporizer through a pressurization with an inert gas;

at least about 99% of the liquid state precursor is vaporized in the vaporizer;

substantially all of the liquid state precursor is vaporized in the vaporizer;

the liquid state precursor is vaporized at a temperature between about 10° C. and about 80° C.;

the substrate is a silicon type substrate suitable for semiconductor manufacturing; and the substrate is a ceramic-based substrate.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
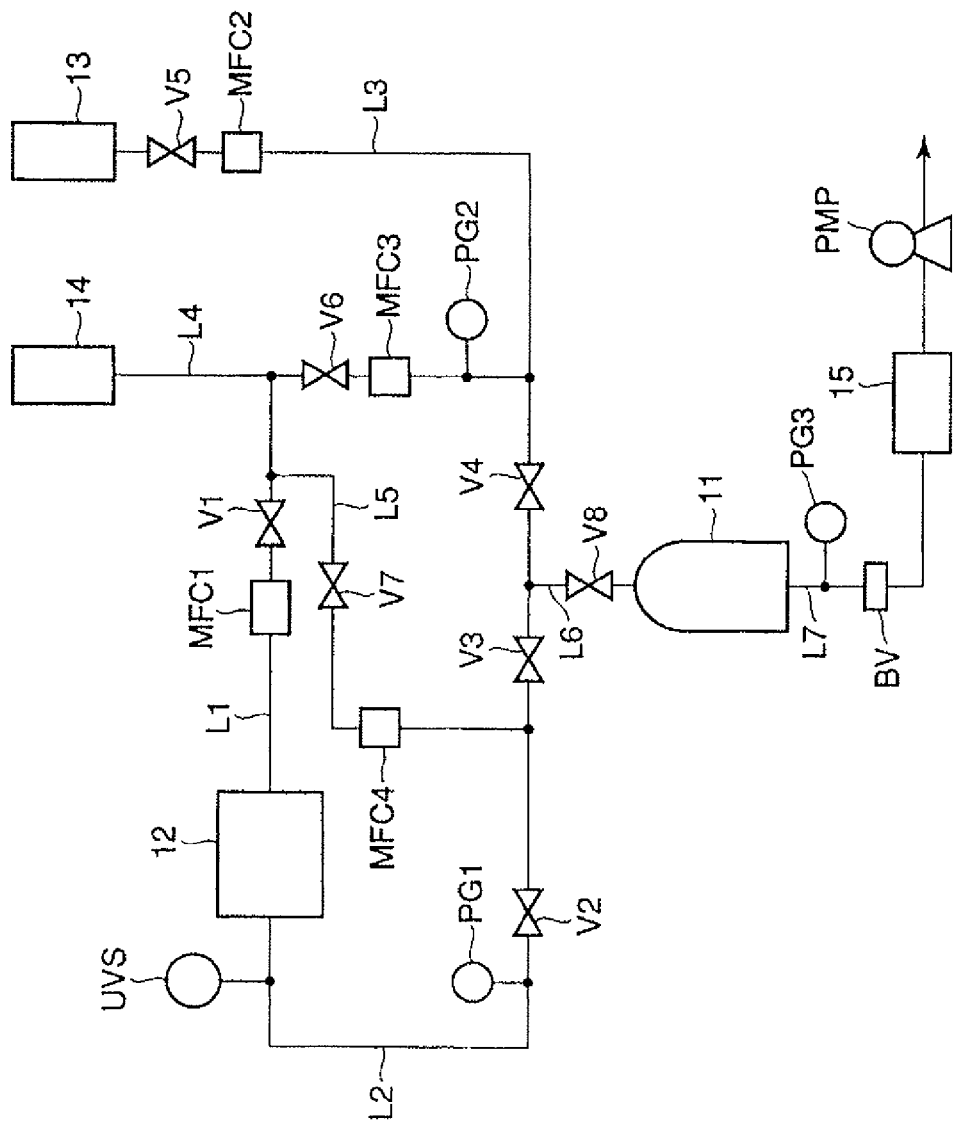
FIG. 1 illustrates one embodiment of an apparatus for depositing a ruthenium containing film.

Generally, the current invention relates to methods for providing a film on substrate in a semiconductor manufacturing process comprises, providing a reaction chamber and a substrate contained within the chamber. A ruthenium based precursor mixture is provided, where the precursor comprises a mixture of at least two non-flammable fluorinated solvents, ruthenium tetroxide dissolved in the solvent mixture, and less than about 100 ppm of moisture. A ruthenium containing film is then deposited on the substrate.

Non-flammable solvents are preferably used in the precursor mixture because non-flammable solvents are preferred when the mixture is used in an environment above room temperature. Non-flammable solvents are also preferred because they generally minimize the risk of introducing carbon into the film deposited on the substrate. Generally, fluorinated solvents are preferred because the presence of fluorine in the solvent molecule makes it non-flammable, while introducing no appreciable negative affect to the film composition.

In some embodiments of the current invention the solvent mixture is made of at least two solvents, each of which can be described according to the general formula:

$C_x H_y F_z O_t N_u$ wherein:

$x \geq 3$;
$y+z \leq 2x+2$;
$z \geq 1$;
$t \geq 0$;
$u \geq 0$; and
$t+u \geq 0$, and wherein x, y, z, t, and u are all integers.

Several solvents satisfy this general formula and would be suitable for use in the solvent mixture. These solvents include: Methyl perfluoropropyl ether; methyl nonafluorobutyl ether; ethyl nonafluorbutyl ether; 1,1,1,2,2,3,4,5,5,5-decafluoro-3-methoxy-4-(trifluoromethyl)-Pentane; 3-ethoxy-1,1,1,2,3,4,4,5,5,6,6,6-dodecafluoro-2-trifluoromethyl-hexane; $C_9F_{12}N$; $C_{12}F_{27}N$; $C_{12}F_{33}N$; $C_6F_{14}$; $C_8F_{16}$; $C_7F_{16}$; $C_5F_{15}H_2$; $C_4F_5H_5$; 1,1,2,3,3 penta fluoro propane; CF3CFHCF2 CH2OCF2 CFHOC3F7; and C3F7OCFHCF2CH (CH3)OCF2CFHOC4F9.

In one embodiment the solvent mixture is a mixture of methyl nonafluorobutyl ether and ethyl nonafluorbutyl ether. Both of these are available commercially from the 3M Company, and are sold under the trade names of Novec HFE 7100 and Novec HFE 7200. $C_5F_{10}H_2$ is also commercially available from DuPont under the trade name of Vertrel.

In some embodiments, the substrate on which the ruthenium containing film is deposited may vary. The substrate may be a semiconductor substrate which may have already had other layers of materials deposited upon it from other semiconductor manufacturing steps. The substrate may also be a ceramic substrate (e.g. silicon dioxide, etc), a metallic substrate, or a polymer substrate.

In some embodiments the substrate has a different shape. The substrate may be flat, such as a typical semiconductor wafer, or a ceramic substrate for hybrid circuits. The substrate may also be a bumped or a ball shaped surface. The substrate may also be a nanoparticle or another material characterized by a large specific surface area.

The ruthenium tetroxide ($RuO_4$) concentration of the precursor mixture according to the current invention is suitably selected as a function of the film formation conditions and the material of the substrate on which the film will be formed.

Embodiments of the ruthenium based precursor according to the invention offers at least the following advantages.

As $RuO_4$ in pure form poses an explosion risk, the dissolution of $RuO_4$ in a fluorinated solvent mixture enables $RuO_4$ to be handled in a stable form without risk of explosion during storage or holding.

The non-flammable solvent mixture does not react with $RuO_4$ and can therefore avoid the $RuO_4$ decomposition that occurs with the use of water. This enables stable long-term holding (storage) of the ruthenium based precursor.

The desired ruthenium-containing film can in fact be produced since the non-flammable solvent fluorinated solvent in the ruthenium based precursor does not react with $RuO_4$ when this precursor is used in gaseous form to produce film by thermal CVD.

In the case of the current ruthenium based precursor, the non-flammable solvent mixture does not react with the active Ru compounds produced when $RuO_4$ decomposes in the reaction chamber and the solvent mixture is discharged from the reaction chamber along with any unreacted gas. This makes it possible to obtain the desired ruthenium-containing film without it containing unwanted compounds such as oxides.

By contrast, if the ruthenium based precursor were formed by dissolution of $RuO_4$ in water and then a film formation by thermal CVD is carried out by delivering such a precursor in gaseous form to a reaction chamber, the $RuO_4$ would undergo decomposition and produce active Ru. This active Ru would then react with the water, producing unwanted oxide. This makes it difficult to produce the desired ruthenium-containing film. In some embodiments, the ruthenium based precursor is substantially free of moisture content, containing less than 100 ppm, preferably less than 1 ppm of moisture.

The non-flammable solvent mixture in the ruthenium based precursor is preferably not toxic. This makes it possible to implement film production in a safe environment when a ruthenium-containing film is produced by thermal CVD using the gaseous ruthenium based precursor.

The fluorinated solvent mixture in the ruthenium based precursor is preferably non flammable and exhibits a high thermal stability, which makes it possible—when this ruthenium based precursor is used in gaseous form for the production of ruthenium-containing film by thermal CVD—to avoid incorporation of carbon into the film as well as decomposition, combustion, or explosion by the solvent mixture.

According to various embodiments, a ruthenium containing film is formed by depositing ruthenium containing film on a substrate by introducing, in gaseous form, at least the inventive ruthenium based precursor into a reaction chamber that holds the substrate.

According to these methods, Ruthenium containing films that are possible to deposit, include, but are not limited to:
a ruthenium film,
a ruthenium oxide film ($RuO_2$ film), and
a ruthenate film.

Method for Forming Ruthenium Film

According to an embodiment, a ruthenium film is formed by introducing the ruthenium based precursor in gaseous form and gaseous reducing agent into a reaction chamber that holds a substrate and depositing ruthenium on the substrate by reacting the precursor with the reducing agent.

In some embodiments, the ruthenium based precursor can be introduced into the reaction chamber using a bubbler system. That is, the ruthenium based precursor, being a liquid as noted above, may be held within a vessel and an inert gas (e.g., nitrogen, argon, helium, etc.) may be bubbled into this (possibly temperature controlled) vessel using an inert gas bubbling tube, resulting in delivery into the reaction chamber of the inventive precursor entrained in the inert gas.

In some embodiments, the ruthenium based precursor may be introduced into the reaction chamber through a direct vaporization system. Such a system is known in the art, and may include a liquid mass flow controller and a vaporizer, such as a glass or metal tube. Inert gas (e.g. nitrogen, argon, helium, etc) may be used to pressurize the liquid phase ruthenium based precursor, and cause it to flow from its storage vessel, through a liquid flow controller, and into the vaporizer. If inert gas is not used to cause the liquid to flow, a vacuum (or lower pressure condition) may be generated downstream of the precursor storage vessel, for instance, at the vaporizer outlet. In some embodiments, the vaporizer is heated to a temperature between about 10° C. and about 80° C. The temperature of the vaporizer causes the liquid phase precursor to vaporize into a vapor phase precursor. In some embodiments, about 99%, and preferably all, of the liquid phase precursor vaporize into a vapor phase precursor. This vapor phase precursor is then delivered to the reaction chamber.

In some embodiments, the reducing agent under consideration reduces ruthenium tetroxide to ruthenium metal. This reducing agent can be specifically exemplified by hydrogen ($H_2$), but is not limited thereto.

Other possible reducing agents include hydrazine and its derivatives and hydrocarbons (e.g. alkene, alkyne, aromatic rings, etc). A single reducing agent or the combination of two or more reducing agents can be used. Hydrogen is particularly preferred for the reducing agent.

In some embodiments, either chemical vapor deposition (CVD) or atomic layer deposition (ALD) can be used to form the ruthenium film.

In embodiments where CVD is the deposition method used, the gaseous reducing agent and gaseous ruthenium based precursor according to the invention are introduced simultaneously in the reaction chamber. The reducing agent and the $RuO_4$ in the precursor react in the gas phase, resulting in reduction of the $RuO_4$ to ruthenium, which deposits on the substrate. The non-flammable fluorinated solvent mixture that accompanies the $RuO_4$ in the gaseous precursor does not undergo decomposition during this deposition, and its incorporation into the resulting ruthenium film is therefore also avoided.

The total pressure in the reaction chamber during this film production is preferably maintained between about 0.01 torr to 1000 torr and is more preferably maintained between about 0.1 torr to 10 torr. The substrate is preferably heated to between about 50° C. to 800° C. and is more preferably heated to between about 100° C. to 400° C. The reducing agent is admitted into the reaction chamber in sufficient quantity to reduce the $RuO_4$ in the precursor to ruthenium metal. When for example hydrogen is used as the reducing agent, at least 4 moles hydrogen are used per 1 mole $RuO_4$ in the precursor. The by-product in this case is $H_2O$.

In some embodiments where ALD is the deposition method used, the gaseous ruthenium based precursor is initially introduced into the reaction chamber and a very thin layer (e.g. a monoatomic layer) of ruthenium oxide is formed on the substrate by adsorption and decomposition of the precursor. The interior of the reaction chamber is then purged with an inert gas (e.g. nitrogen, helium, argon) in order to remove the unreacted or unadsorbed ruthenium based precursor—which includes the hereinabove specified non-flammable fluorinated solvent mixture. This purge is followed by the introduction of the gaseous reducing agent into the reaction chamber. The incoming reducing agent reacts with the monoatomic layer of ruthenium oxide formed on the substrate and reduces the ruthenium oxide to ruthenium metal. This results in the formation of a monoatomic layer of ruthenium on the substrate. When the growth of a thicker ruthenium film is desired, the following sequence can be repeated after the unreacted reducing agent and gaseous reaction products generated by the reducing agent have been purged from the reaction chamber: introduction of the gaseous ruthenium based precursor, purge/removal of the residual ruthenium based precursor, introduction of the reducing agent, purge/removal of reducing agent and gaseous reaction products.

In some embodiments, the introduction of the gaseous ruthenium based precursor and reducing agent may be carried out by pulse delivery in the case of ALD. The gaseous ruthenium based precursor can be introduced, for example, for between about 0.01 second to 10 seconds at a flow rate of about 0.1 sccm to 10 sccm and the reducing agent can be introduced, for example, for between about 0.01 second at a flow rate of about 0.5 sccm to 100 sccm. The purge gas can also be introduced, for example, for between about 0.01 second to 10 seconds at a flow rate of about 100 sccm to 5000 sccm.

The total pressure in the reaction chamber during ALD may preferably be maintained between about 0.1 torr to 10 torr, while the substrate temperature is preferably maintained at a temperature between about 100° C. to 600° C.

Method for Forming Ruthenium Oxide Film ($RuO_2$ Film)

According to some embodiments, the ruthenium based precursor is introduced in gaseous form into a reaction chamber that holds a substrate. This ruthenium based precursor can be introduced into the reaction chamber in gaseous form by a bubbler system or through a direct vaporization system. In this case the substrate is heated to a temperature at which the $RuO_4$ in the precursor is decomposed and solid ruthenium oxide (ruthenium dioxide) is produced. The solid ruthenium oxide produced by $RuO_4$ decomposition deposits on the substrate. The non-flammable fluorinated solvent mixture that accompanies the $RuO_4$ in the gaseous precursor does not undergo decomposition during this deposition of ruthenium oxide, and its incorporation into the ruthenium oxide film is therefore also avoided. The solid ruthenium oxide ($RuO_2$) functions as a decomposition catalyst for the gaseous $RuO_4$. As a result, once the gaseous $RuO_4$ has been decomposed under the application of heat and solid ruthenium oxide produced by this decomposition has deposited on the substrate, the gaseous $RuO_4$ can be satisfactorily decomposed even when the heating temperature is reduced.

The total pressure within the reaction chamber during this ruthenium oxide deposition is preferably between about 0.01 torr to 1000 torr and more preferably is between about 0.1 to 5 torr. The substrate is preferably heated to at least 150° C. and more preferably is heated to a temperature between about 350° C. to 400° C.

The substrate submitted to the film formation methods described above can be exemplified by semiconductor substrates such as silicon substrates. The following, for example, may be formed on this semiconductor substrate: low-k film, high-k film, C-doped silicon dioxide film, titanium nitride film, copper film, tantalum nitride film, molybdenum film, tungsten film, and ferroelectric film. The ruthenium films and ruthenium oxide films afforded by this invention exhibit an excellent adherence to these films and will not debond even when submitted to chemical mechanical polishing (CMP). Moreover, the incorporation of impurities, such as carbon and halogens such as fluorine, is entirely absent from these ruthenium films, ruthenium oxide or ruthenium-containing films. In addition, an incubation period is either unnecessary in the present invention or is very brief, which enables deposition (growth) of the ruthenium films and ruthenium oxide films in a correspondingly shorter period of time (from the initial early phase in the case of ALD, several minutes for CVD).

Turning now to FIG. 1, an illustrative example of an apparatus that may be used to implement film deposition methods by CVD is described.

The apparatus illustrated in FIG. 1 is provided with a reaction chamber 11, a feed source 12 for the ruthenium based precursor, a feed source 13 for reducing agent gas, and a feed source 14 for an inert gas as typically used as a carrier gas and/or diluent gas. In the case of a single-wafer tool, a susceptor (not shown) is provided in the reaction chamber 11 and a single semiconductor substrate (not shown), such as a silicon substrate, is mounted on the susceptor. The interior of the susceptor is provided with a heater for heating the semiconductor substrate to the prescribed reaction temperature. In the case of a batch tool, from 5 to 200 semiconductor substrates are held in the reaction chamber 11. The heater in a batch tool may have a different structure from that of the heater in a single-wafer tool.

The feed source 12 for the ruthenium based precursor introduces the ruthenium based precursor into the reaction chamber 11 using either the bubbler system or the direct vaporization system already described above and is connected to the inert gas feed source 14 by a line L1. The line L1 is provided with a shutoff valve V1 and downstream therefrom with a flow rate controller, for example, a mass flow controller MFC1. The ruthenium based precursor is introduced into the reaction chamber 11 from the feed source 12 through a line L2. The following are provided in the line L2 considered from the upstream side: a UV spectrometer UVS, a pressure gauge PG1, a shutoff valve V2, and a shutoff valve V3. The UV spectrometer UVS functions to confirm the presence and detect the concentration of the precursor (particularly the $RuO_4$) in the line L2.

The feed source 13 for the reducing agent gas comprises a vessel that holds the reducing agent in gaseous form. The reducing agent gas is admitted into the reaction chamber 11 from this feed source 13 through a line L3. A shutoff valve V4 is provided in the line L3. The line L3 is connected to the line L2.

The inert gas feed source 14 comprises a vessel that holds inert gas in gaseous form. Inert gas can be introduced from this feed source into the reaction chamber 11 through a line L4. The following are provided in the line L4 considered from the upstream side: a shutoff valve V6, a mass flow controller MFC3, and a pressure gauge PG2. The line L4 joins with the line L3 upstream from the shutoff valve V4. The line L1 branches off the line L4 upstream from the shutoff valve V6.

A line L5 branches from the line L1 upstream from the shutoff valve V1. This line L5 joins into the line L2 between the shutoff valves V2 and V3. A shutoff valve V7 and a mass flow controller MFC4 are disposed in the line L5 in the given sequence from the upstream side.

A line L6, which reaches to the reaction chamber 11, branches off between the shutoff valves V3 and V4. A shutoff valve V8 is provided in this line L6.

A line L7, which reaches to a pump PMP, is provided at the bottom of the reaction chamber 11, and the following are provided in this line L7 considered from the upstream side: a pressure gauge PG3, a butterfly valve BV for adjusting the back pressure, and a hot trap 15. The hot trap 15 comprises a tube that is provided over its circumference with a heater. Since the $RuO_4$ in the gaseous precursor is converted into solid ruthenium oxide by thermal decomposition, the $RuO_4$ introduced into this hot trap 15 can be eliminated from the gas stream by conversion into solid ruthenium oxide, which deposits on the inner wall of the tube.

In order to produce ruthenium film using the apparatus illustrated in FIG. 1, the shutoff valves V1, V2, and V5 are first closed and the shutoff valves V6, V7, V3, V4, and V8 are opened. While operating the pump PMP, the inert gas from the inert gas feed source 14 are introduced into the reaction chamber 11 through the line L4 and L5 via the line L6.

The shutoff valve V5 is then opened and reducing agent gas is introduced into the reaction chamber 11 from the reducing agent gas feed source 13, followed immediately by the opening of shutoff valves V1 and V2 and the introduction of inert gas from the inert gas feed source 14 through the line L1 and into the feed source 12 for the ruthenium based precursor. This results in the introduction of gaseous precursor ($RuO_4$ and the hereinabove specified non-flammable solvent, preferably a fluorinated solvent) into the reaction chamber 11 via the line L2 and the line L6. The reducing agent gas and $RuO_4$ react in the reaction chamber 11, resulting in the deposition of ruthenium metal on the semiconductor substrate.

In order to produce a solid ruthenium oxide film using the apparatus illustrated in FIG. 1, the apparatus is prepped by closing the shutoff valves V5 as well as V4 and V6 and keeping these valves closed since the reducing agent gas will not be used. The pump PMP is started, a vacuum condition is created, and shutoff valves V3, V7, and V8 are opened in order to have inert gas flown in the reaction chamber. While in this state, the shutoff valves V1, V2, are opened and inert gas is introduced from the inert gas feed source 14 through the line L4 and the line L1 into the feed source 12 for the ruthenium based precursor, resulting in the introduction of gaseous precursor ($RuO_4$ and the hereinabove specified non-flammable solvent, preferably a fluorinated solvent) into the reaction chamber 11 via the line L2 and the line L6. Since the reaction chamber 11 is being heated, the $RuO_4$ introduced into the reaction chamber 11 undergoes thermal decomposition into solid ruthenium oxide, which deposits on the substrate.

Figure 2:
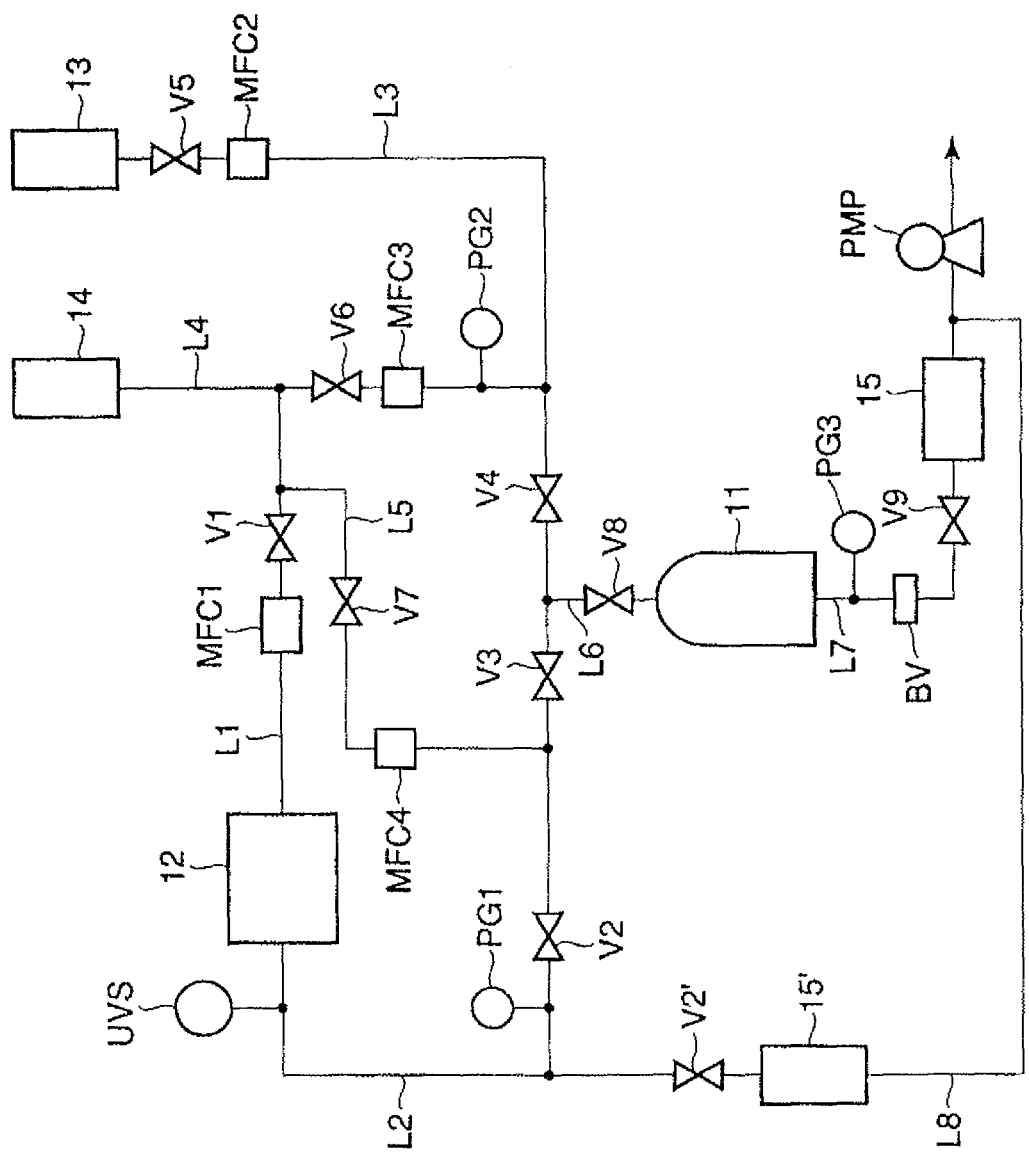
FIG. 2 illustrates another embodiment of an apparatus for depositing a ruthenium containing film.

Turning now to FIG. 2, an illustrative example of an apparatus that may be used to implement film deposition methods by ALD is described.

The apparatus illustrated in FIG. 2 has a structure in which a line L8 is provided in the apparatus illustrated in FIG. 1; this line L8 is itself provided with a shutoff valve V2' and, downstream from the shutoff valve V2', with a hot trap 15' that is the same as the hot trap 15. The same reference symbols have therefore been assigned to those elements that are the same as in FIG. 1, and these elements will not be described in detail again. One end of the installed line L8 is connected to the line L2 between the ultraviolet spectrometer UVS and the pressure gauge PG1, while the other end is connected to the line L7 between the hot trap 15 and the pump PMP.

In order to produce a ruthenium film by ALD using the apparatus illustrated in FIG. 2, the shutoff valves V2 and V5 are first closed and the shutoff valves V6, V7, V3, V4, V8, and V9 are opened, as are the shutoff valves V1 and V2'. As the pump PMP is operating, a vacuum state is generated in the different lines in which inert gas from the inert gas feed source 14 is introduced through the lines L4 and L5 and into the reaction chamber 11 via the line L6. The passage of inert gas through the line L1, the feed source 12 for the ruthenium based precursor, results in the flow of gaseous precursor ($RuO_4$ and the non-flammable fluorinated solvent mixture) in L2 and L8, along with the inert gas.

After this initial set up has been carried out, the shutoff valve V2' is closed and the shutoff valve V2 is opened and a pulse of gaseous precursor is delivered into the reaction chamber 11. This is followed by the simultaneous closure of the shutoff valve V2 and the opening of the shutoff valve V2', which results in passage through the line L8 of gaseous precursor along with inert gas which will be decomposed in hot-trap 15'. A purge of the reaction chamber interior by the introduction into the reaction chamber 11 of inert gas from L4 and L5 via L6 leading to the removal of unreacted precursor (including the solvent mixture) and generated by-products from the interior of the reaction chamber 11. The shutoff valve V5 is then opened and a pulse of reducing agent gas is delivered from the reducing agent gas feed source 13 along with inert gas from the inert gas feed source 14 into the reaction chamber 11. This is followed by closure of the shutoff valve V5, resulting in the delivery of a pulse of inert gas into the reaction chamber 11 and removal of reaction by-products, unreacted reducing agent, etc., from the reaction chamber 11. This process cycle may be repeated until a ruthenium film with the desired thickness is obtained.

Method for Forming Ruthenate Film

In some embodiments, a ruthenate film is formed by introducing the hereinabove specified ruthenium based precursor in gaseous form and a gaseous organometallic compound into a reaction chamber that holds a substrate and reacting the precursor and organometallic compound in the presence of an oxygenated gas and thereby depositing ruthenate on the surface of the substrate.

The ruthenium based precursor can be introduced into the reaction chamber by either a bubbler system or a direct vaporization system, as described above.

When, for example, a ferroelectric film of $BaRuO_x$ is to be produced, $Ba(DPM)_2$, which is a β-diketone/barium complex, can be used as the organometallic compound. When a ferroelectric film of $SrRuO_x$ is to be produced, $Sr(DPM)_2$, which is a β-diketone/strontium complex, can be used as the organometal compound. Here, DPM is an abbreviation for dipivaloylmethanate or 2,2,6,6-tetramethyl-3,5-heptanedionate (TMHD).

The oxygenated gas can be, for example, oxygen, ozone or $N_2O$.

In some embodiments, CVD may be used to form the ferroelectric films mentioned above, in which case the ruthenium based precursor in gaseous form and the organometallic metal in gaseous form are introduced into the reaction chamber. The $RuO_4$ in the precursor and the organometallic compound then react in the gas phase in the presence of oxygen, resulting, for example, in the formation of $BaRuO_x$ (or $SrRuO_x$) and its deposition on the substrate. At the same time, however, the non-flammable fluorinated solvent mixture, accompanying the $RuO_4$ in the gaseous precursor does not undergo decomposition during deposition of the ferroelectric film, thereby also avoiding incorporation into the film.

The temperature in the reaction chamber is preferably between about 450° C. to 800° C., which is the reaction temperature for these gases.

The ruthenate films (for example, $BaRuO_x$ and $SrRuO_x$) produced by this method exhibit ferroelectric properties and can be used, for example, in capacitors. Moreover, since thin ferroelectric films can be produced by this method, these films can be used as electrode materials just like the Ru films and $RuO_2$ films. In specific terms, these ferroelectric films (particularly $SrRuO_x$) can be used as the upper and lower electrode materials for a separate ferroelectric (or as a buffer layer between a ferroelectric and the electrode material). These ferroelectric films, being oxides, can prevent oxygen and PbO diffusion with respect to ferroelectrics such as lead lanthanate titanate (PLT) and lead zirconate titanate (PZT), and at the same time, by adopting the same perovskite structure as these ferroelectrics, can increase the adherence at the interface of the electrode material with these ferroelectrics and can prevent or lessen, inter alia, generation of the low dielectric constant layer that can occur at this interface and can prevent or lessen deterioration.

EXAMPLES

The following non-limiting example is provided to further illustrate embodiments of the invention. However, the examples are not intended to be all inclusive and are not intended to limit the scope of the inventions described herein.

Example 1

Ruthenium precursors made of ruthenium tetroxide dissolved in a solvent mixture of 48% HFE-7100 and 52% HFE-7200 were directly vaporized at various vaporizer temperatures to determine precursor liquid flow rates corresponding to full direct vaporization (as defined as no liquid remaining in the vaporizer). High purity argon was used as carrier gas to pressurize the liquid precursor and cause it to flow into the vaporizer. The base vacuum pressure at the exit of the vaporizer was 67 torr, and a glass U-tube filled with glass beads was used as the vaporizer.

|  | Sample | | | |
| --- | --- | --- | --- | --- |
|  | 1 | 2 | 3 | 4 |
| [RuO$_4$] % | 0.42% | 1.5% | 1.5% | 1.5% |
| Temp C. | 50 | 50 | 30 | 30 |
| Pressure (torr) | 67 | 67 | 67 | 67 |
| Ar (sccm) | 278 | 278 | 278 | 278 |
| Precursor flow rate (ml/min) | 1.8 | 1.6 | 1.8 | 1.6 |
| Full Evaporization? | Yes | Yes | Yes | Yes |

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A composition comprising ruthenium tetroxide dissolved in a mixture of methyl nonafluorobutyl ether and ethyl nonafluorobutyl ether.

2. The composition of claim 1 having less than about 100 ppm of moisture.

3. The composition of claim 1 wherein the solvent mixture comprises between about 10% and 90% of methyl nonafluorobutyl ether.

4. The composition of claim 3 wherein the solvent mixture comprises about 30% of methyl nonafluorobutyl ether.

5. The composition of claim 1 wherein the solvent mixture comprises between about 10% and 90% of ethyl nonafluorobutyl ether.

6. The composition of claim 5, wherein the solvent mixture comprises about 70% of ethyl nonafluorobutyl ether.

7. The composition of claim 6 further comprising about 30% methyl nonafluorobutyl ether.

8. The composition of claim 7 consisting essentially of ruthenium tetroxide dissolved in a solvent mixture of about 70% of ethyl nonafluorobutyl ether and about 30% methyl nonafluorobutyl ether.

9. The composition of claim 7 consisting of ruthenium tetroxide dissolved in a solvent mixture of about 70% of ethyl nonafluorobutyl ether and about 30% methyl nonafluorobutyl ether the mixture having less than 100 ppm moisture.

* * * * *